(12) United States Patent
Takata

(10) Patent No.: US 6,717,487 B2
(45) Date of Patent: Apr. 6, 2004

(54) SURFACE ACOUSTIC WAVE FILTER, AND COMMUNICATION APPARATUS USING THE SAME

(75) Inventor: Toshiaki Takata, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/995,557

(22) Filed: Nov. 29, 2001

(65) Prior Publication Data
US 2002/0093399 A1 Jul. 18, 2002

(30) Foreign Application Priority Data
Jan. 12, 2001 (JP) .......................... 2001-005644

(51) Int. Cl.$^7$ .............. H03H 9/64; H03H 9/72
(52) U.S. Cl. .............. 333/133; 333/193; 333/195; 310/313 B; 310/313 D
(58) Field of Search .............. 333/133, 193–196; 310/313 R, 313 B, 313 C, 313 D, 313 A (56) References Cited

U.S. PATENT DOCUMENTS

| | | | | |
|---|---|---|---|---|
| 5,726,610 A | * | 3/1998 | Allen et al. | 333/133 |
| 5,729,186 A | * | 3/1998 | Seki et al. | 333/194 |
| 5,796,205 A | * | 8/1998 | Nishihara et al. | 310/313 R |
| 5,818,146 A | * | 10/1998 | Kurahashi et al. | 310/313 R |
| 5,889,446 A | * | 3/1999 | Yamada et al. | 333/193 |
| 6,037,700 A | * | 3/2000 | Tanaka et al. | 310/313 D |
| 6,404,101 B1 | * | 6/2002 | Taniguchi et al. | 310/313 A |
| 6,437,668 B1 | * | 8/2002 | Nakao et al. | 333/193 |

FOREIGN PATENT DOCUMENTS

| | | | |
|---|---|---|---|
| JP | 9-93072 | * | 4/1997 |
| JP | 11-330905 | * | 11/1999 |

* cited by examiner

Primary Examiner—Barbara Summons
(74) Attorney, Agent, or Firm—Keating & Bennett, LLP

(57) ABSTRACT

A surface acoustic wave filter includes a plurality of one-terminal-pair surface acoustic wave resonators each including interdigital electrodes and an insulating film deposited on the interdigital electrodes. The one-terminal-pair surface acoustic wave resonators include a series arm resonator and a parallel arm resonator. When the electrode duty of a one-terminal pair surface acoustic resonator is defined by the following equation (1):

$$\text{electrode duty} = 2 \times W/\lambda \qquad (1)$$

where $\lambda$ denotes the wavelength of the one-terminal-pair surface acoustic wave resonator, and W denotes the line width of an interdigital electrode, the electrode duty of the parallel arm resonator is greater than the electrode duty of the series arm resonator. With this structure, a single deposition of the insulating film is sufficient to achieve the desired frequency adjustment without the frequency bandwidth being narrowed.

10 Claims, 7 Drawing Sheets

| SAMPLE | DUTY RATIO OF PARALLEL ARM RESONATORS | DUTY RATIO OF SERIES ARM RESONATORS |
|---|---|---|
| A | 0.55 | 0.37 |
| B | 0.51 | 0.41 |
| C | 0.46 | 0.46 |
| D | 0.41 | 0.51 |

| SAMPLE | DUTY RATIO OF PARALLEL ARM RESONATORS | DUTY RATIO OF SERIES ARM RESONATORS |
|---|---|---|
| A | 0.55 | 0.37 |
| B | 0.51 | 0.41 |
| C | 0.46 | 0.46 |
| D | 0.41 | 0.51 |

Tx BAND 1705–1785  Rx BAND 1805–1880  GUARD BAND 1920–1980 (MHz)

FIG. 8B

Tx BAND 1850–1910  Rx BAND 1930–1990  GUARD BAND 2010–2070 (MHz)

SURFACE ACOUSTIC WAVE FILTER, AND COMMUNICATION APPARATUS USING THE SAME

BACKGROUND OF THE INVENTION

1. Field of the Invention

The present invention relates to a surface acoustic wave (SAW) filter preferably for use in a communication apparatus.

2. Description of the Related Art

In general, surface acoustic wave (SAW) filters are used for communication apparatuses such as cellular telephones. As known in the art, various frequency bands are used depending upon the type of cellular telephone, and various frequency adjusting methods are used to accommodate SAW filters to corresponding frequency bands.

For example, one known method of adjusting frequency bandwidths is to uniformly apply an insulating film to an entire surface of a piezoelectric substrate of a SAW filter that contains interdigital electrodes, and to etch the insulating film so as to provide a thickness according to a desired frequency. A process of manufacturing a SAW filter according to such a method is described below.

FIGS. 1A to 1D are views illustrating a series of procedures to manufacture a known SAW filter.

Figure 1A:
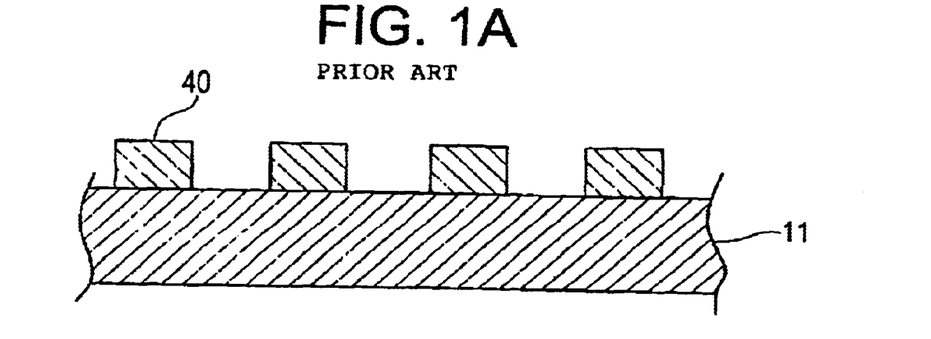
FIGS. 1A to 1D are illustrations of a series of procedures to manufacture a typical SAW filter.

As shown in FIG. 1A, first, a piezoelectric substrate 11 made of $LiTaO_3$ or $LiNbO_3$ is prepared. After the substrate 11 is polished, a resist pattern 40 formed of a photoresist is applied on a surface of the substrate 11 using a well-known technique. Then, a metal film 41 made of Al or Au having a high conductivity is deposited thereon by a technique such as vapor deposition to provide a predetermined thickness.

Figure 1B:
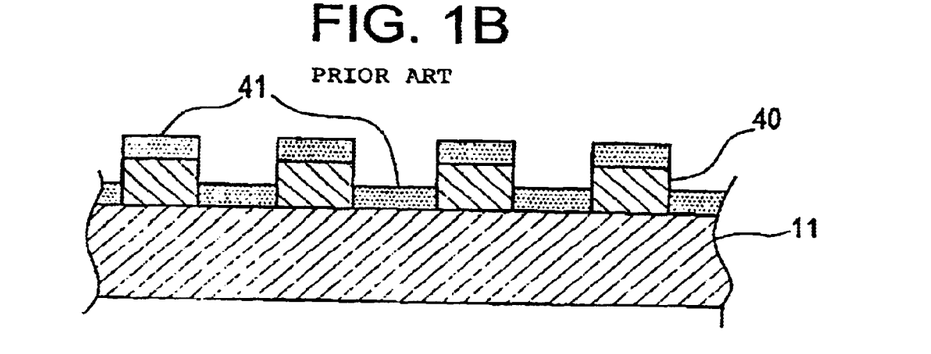

As shown in FIG. 1B, the resultant product is immersed into a solvent, and is then irradiated with ultrasonic waves to simultaneously melt, or simultaneously peel off, and therefore remove the resist pattern 40 and the metal film 41 that overlies the resist pattern 40.

Figure 1C:
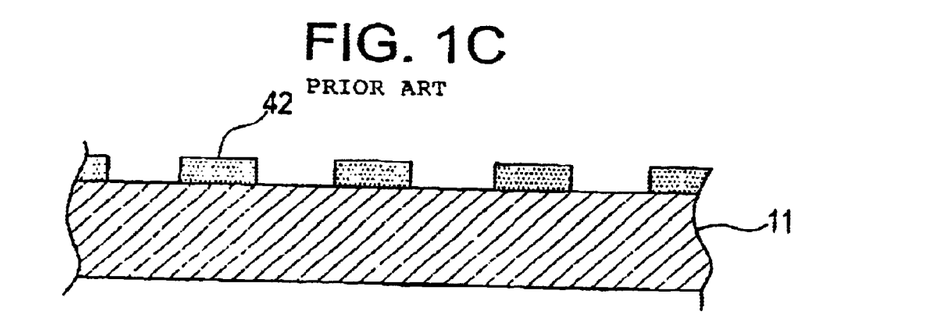

As a result, as shown in FIG. 1C, an electrode 42 having a desired pattern is formed by the remaining metal film. The electrode 42 corresponds to interdigital electrodes and reflectors.

Figure 1D:
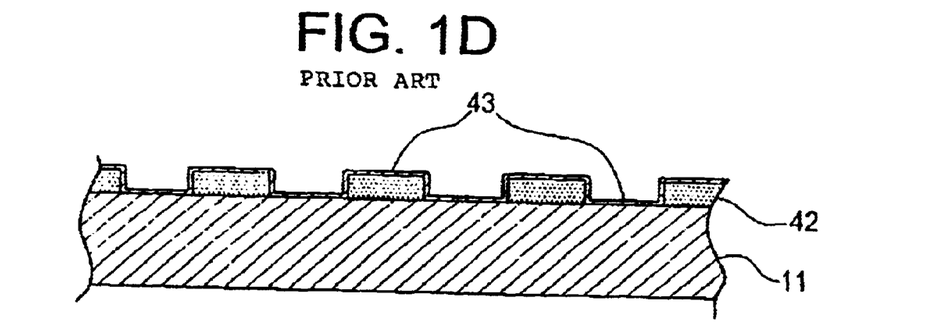

Then, as shown in FIG. 1D, on the entire substrate 11 including the electrode 42, an insulating film 43 made of a material such as $SiO_2$ having a different etching rate from the electrode 42 is deposited and adhered by sputtering or chemical vapor deposition (CVD) so as to provide a predetermined thickness.

A wafer prober is used to apply an electrical signal to the electrode 42 to measure a frequency, and to determine a difference between the measured frequency and the target. In order to make the difference zero, the entire surface of the insulating film 43 is etched by a method such as dry etching while monitoring the etching time to adjust frequencies.

A case where the foregoing typical frequency adjusting method is applied to a so-called ladder type SAW filter is described with reference to FIGS. 2 and 3. The ladder type SAW filter includes at least one series arm resonator constituting a series arm, and at least one parallel arm resonator constituting a parallel arm.

Figure 2A:
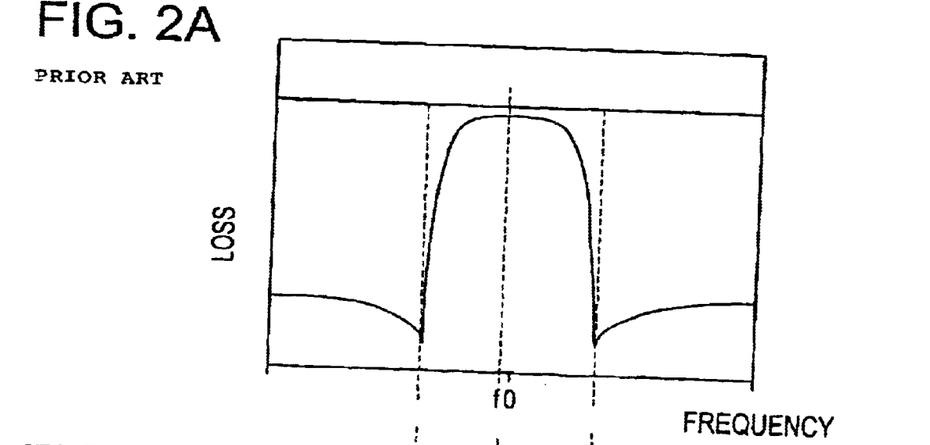
FIG. 2 is a graph of an exemplary frequency characteristic (a) and an exemplary impedance characteristic (b) of a ladder type SAW filter.
Figure 2B:
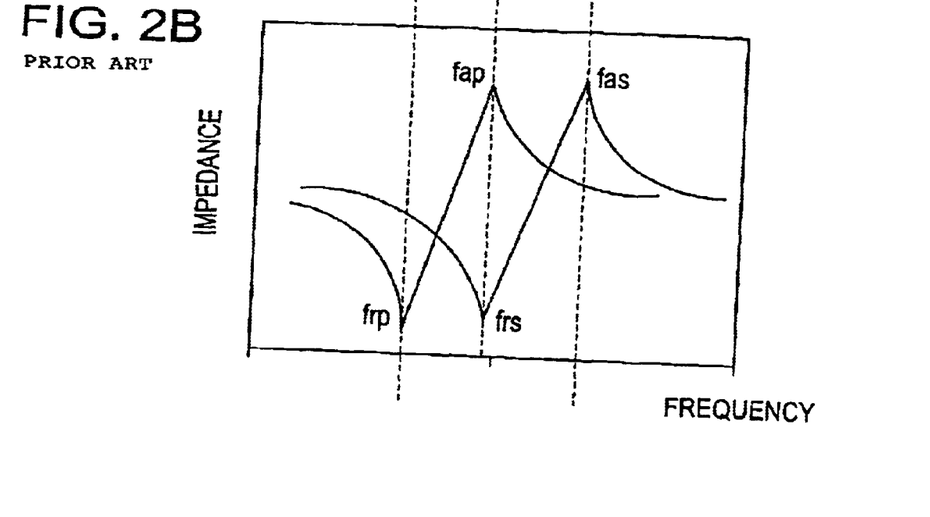

In FIG. 2, an exemplary frequency characteristic of the ladder type SAW filter is indicated by (a), and an exemplary impedance characteristic of the ladder type SAW filter is indicated by (b).

As indicated by (a) and (b) in FIG. 2, if the resonant frequency $f_{rs}$ of the series arm resonator and the anti-resonant frequency $f_{ap}$ of the parallel arm resonator are set to match each other, a band-pass filter having a central frequency $f_0$ is obtained. The bandwidth thereof depends upon the difference between the resonant frequency $f_{rp}$ of the parallel arm resonator and the anti-resonant frequency $f_{as}$ of the series arm resonator.

Figure 3:
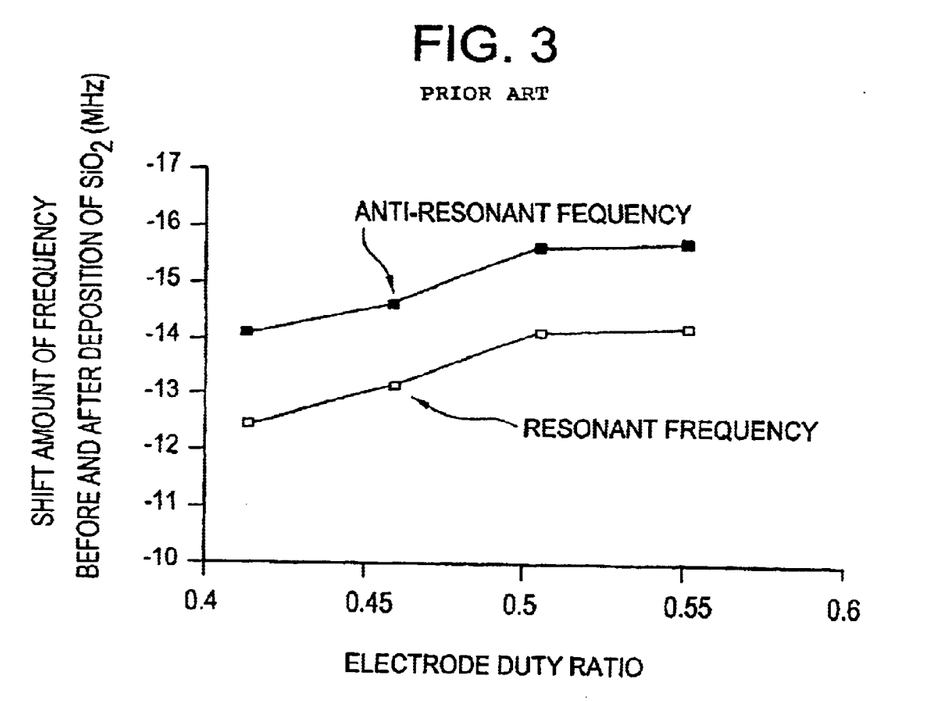
FIG. 3 is a graph showing the shift amount of the resonant frequency and the anti-resonant frequency of a one-terminal-pair SAW device before and after an $SiO_2$ film is deposited.

FIG. 3 is a graph showing the shift amount of the resonant frequency and the anti-resonant frequency of a one-terminal-pair surface acoustic wave (SAW) device before and after an $SiO_2$ film is deposited. This graph shows the mean data of samples where the thickness of an Al electrode is 7.2% of the average wavelength of the resonant frequency and the anti-resonant frequency, and where an insulating film made of $SiO_2$ is deposited so as to provide a film thickness of 1.7% of the average wavelength of the resonant frequency and the anti-resonant frequency.

If the insulating film is deposited over the series arm resonator and the parallel arm resonator so as to provide a uniform thickness, the resonant frequency and the anti-resonant frequency of each of the resonators are shifted down, as shown in FIG. 3. As is known, in this case, the anti-resonant frequency is shifted down more than the resonant frequency.

Normally, the wavelength of series arm resonators is set lower than that of parallel arm resonators, and the lower the wavelength, the greater the shift amount of the frequencies. If an insulating film is deposited with a uniform thickness, the frequencies of series arm resonators are thus shifted down compared to the frequencies of parallel arm resonators.

Accordingly, when an insulating film is deposited, the bandwidth of a SAW filter is narrowed because it depends upon the difference between the resonant frequency $f_{rp}$ of a parallel arm resonator and the anti-resonant frequency $f_{as}$ of a series arm resonator, and the desired characteristic may not be obtained.

In order to avoid such a problem, in the related art, an insulating film is deposited two times, i.e., a first time for a series arm resonator and a second time for a parallel arm resonator. The insulating film is deposited with different thicknesses so that the shift amount of the frequencies may be substantially the same, before being etched. Therefore, the desired frequency adjustment is achieved.

However, ladder type SAW filters experience problems if the above-described frequency adjustment is performed.

The above-described approach requires two separate depositions of an insulating film. This increases the number of procedures and the time required, resulting in an increased production cost.

SUMMARY OF THE INVENTION

In order to overcome the problems described above, preferred embodiments of the present invention provide a surface acoustic wave filter which only requires one deposition of an insulating film in order to achieve the desired frequency adjustment without degrading the frequency bandwidth if it is of the ladder type.

According to one preferred embodiment of the present invention, a surface acoustic wave filter includes a piezoelectric substrate, and a plurality of one-terminal-pair surface acoustic resonators disposed on the piezoelectric substrate. Each of the one-terminal-pair surface acoustic resonators includes interdigital electrodes disposed on the piezoelectric substrate, and an insulating film deposited on and adhered to the interdigital electrodes. At least one of the plurality of one-terminal-pair surface acoustic resonators is a series arm resonator, and at least one of the remaining one-terminal-pair surface acoustic resonators is a parallel arm resonator. The series arm resonator and the parallel arm resonator are coupled in a ladder arrangement.

The electrode duty of the parallel arm resonator is greater than the electrode duty of the series arm resonator when the electrode duty of a one-terminal pair surface acoustic resonator is defined by the following equation (1):

$$\text{electrode duty} = 2 \times W/\lambda \qquad (1)$$

where $\lambda$ denotes the wavelength of the one-terminal-pair surface acoustic wave resonator, and W denotes the line width of an interdigital electrode.

This prevents degradation of the frequency bandwidth when an insulating film is deposited. Thus, an insulating film having a greater thickness can be deposited, and it functions as a protection film, thereby increasing reliability.

The thickness of the insulating film may be adjusted so as to provide a predetermined frequency characteristic.

Preferably, the electrode duty of at least one series arm resonator is about 0.5 or less. As a result, more efficient frequency adjustment can be achieved. Furthermore, the shift amount of the frequency bandwidth for frequency adjustment is less, thereby achieving the frequency adjustment while satisfying the desired filter characteristic.

The surface acoustic wave filter has preferably attenuation standards in the vicinity of a high frequency region and a low frequency region of the pass band.

The surface acoustic wave filter according to a preferred embodiment of the present invention may be suitably implemented as a GSM-1900 or DCS filter for use in a communication apparatus in which a narrow or wide bandwidth may cause defects.

In another preferred embodiment of the present invention, a communication apparatus includes the surface acoustic wave filter in accordance with the preferred embodiment of the present invention described above.

Therefore, the communication apparatus incorporating such a surface acoustic wave filter is inexpensive and has the desired frequency characteristic.

Other features, elements, steps, characteristics and advantages of the present invention will become apparent from the following detailed description of preferred embodiments with reference to the attached drawings.

DETAILED DESCRIPTION OF PREFERRED EMBODIMENTS

A surface acoustic wave (SAW) filter according to a preferred embodiment of the present invention is described with reference to FIGS. 4 to 8. In the following description, the SAW filter has a frequency characteristic of the 1.9 GHz (1960 MHz) band as the central frequency, by way of example.

Figure 4:
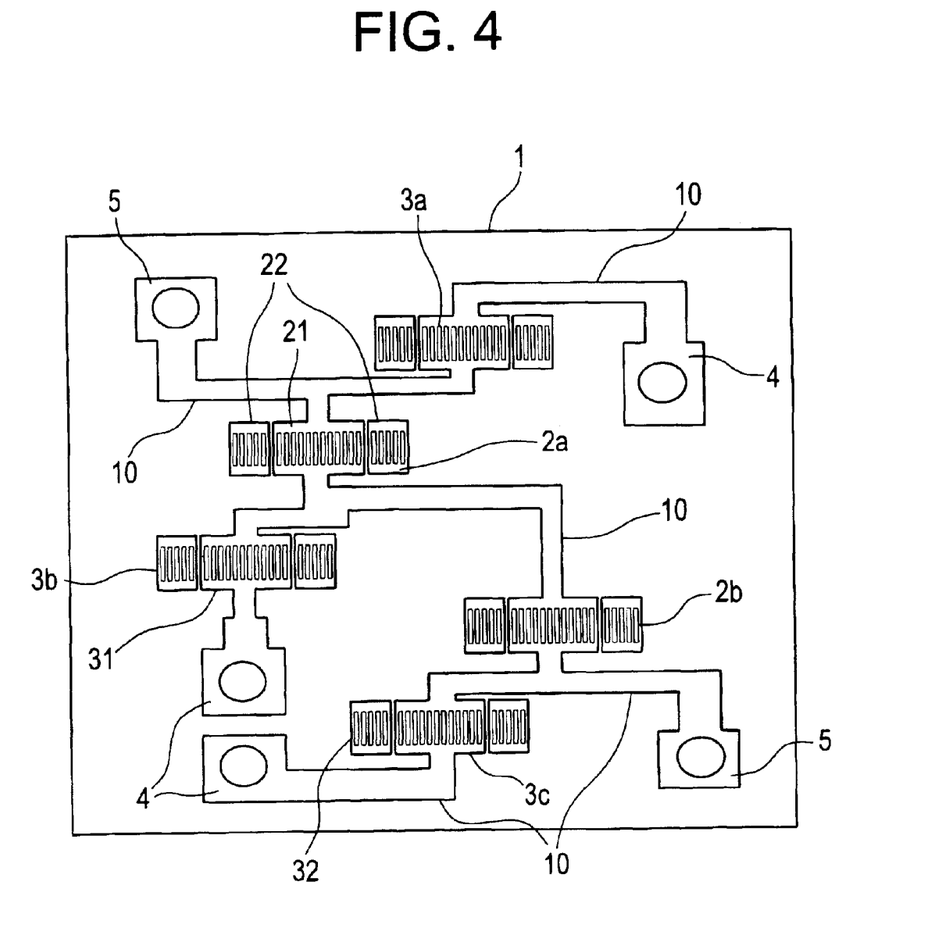
FIG. 4 is a top view of electrodes disposed on a piezoelectric substrate in a SAW filter according to a preferred embodiment the present invention.

FIG. 4 is a top view of electrodes disposed on a piezoelectric substrate of the SAW filter according to a preferred embodiment of the present invention. As shown in FIG. 4, a plurality of one-terminal-pair SAW resonators are mounted on a 36° rotated Y-cut X-propagation $LiTaO_3$ substrate 1 in a ladder fashion. In the illustrated preferred embodiment, the one-terminal-pair SAW resonators include two series arm resonators 2a and 2b defining series arms, and three parallel arm resonators 3a, 3b, and 3c each having one end connected to a series arm and the other end connected to the ground. The SAW resonators are preferably made of aluminum formed by photolithography and etching, or other suitable process. The thickness of the electrode in each of the SAW resonators is about 9.2% of the average wavelength of the series arm resonators 2a and 2b, and the parallel arm resonators 3a, 3b, and 3c. The electrodes are preferably formed in the same way as in the related art, and a detailed description thereof is omitted.

The series arm resonators 2a and 2b each include a pair of interdigital electrodes 21 having interdigitated fingers which face each other and which are spaced at a constant interdigital width, and two reflectors 22 which are arranged at both ends of the interdigital electrodes 21. Likewise, the parallel arm resonators 3a, 3b, and 3c each include a pair of interdigital electrodes 31 having interdigitated fingers which face each other and which are spaced at a constant interdigital width, and two reflectors 32 which are arranged at both ends of the interdigital electrodes 31.

Figure 5:
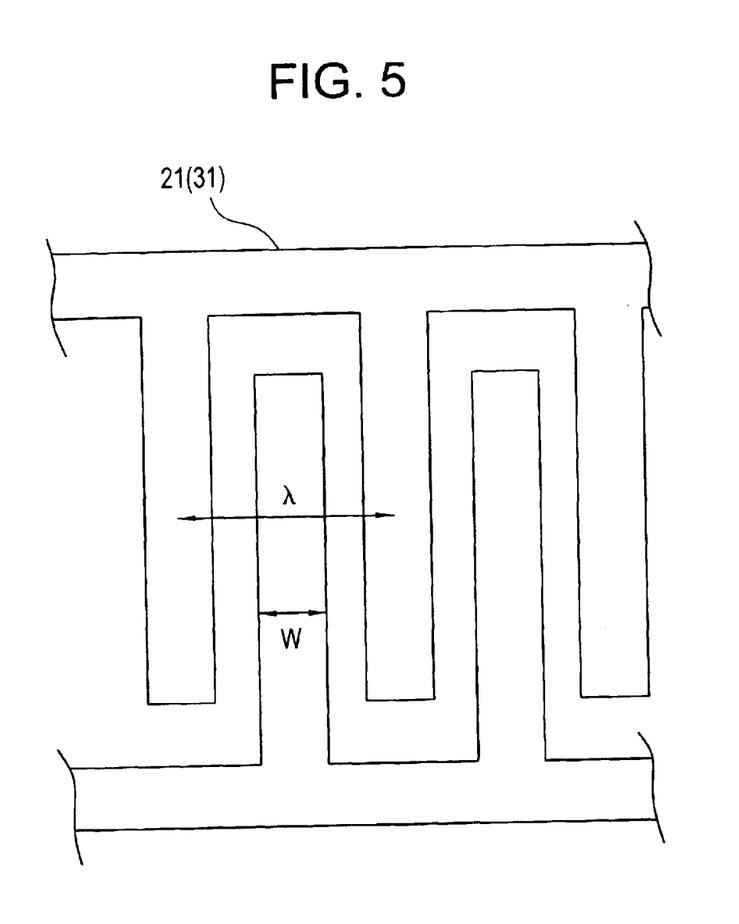
FIG. 5 is a view of an enlarged portion of typical interdigital electrodes.

The present inventor conducted experiments to investigate how the frequency bandwidth increases or decreases by changing the electrode duty of the series arm resonators 2a and 2b and the parallel arm resonators 3a, 3b, and 3c. More specifically, the electrode duty was changed by adjusting the line width of the interdigital electrodes 21 and 31. As used herein, electrode duty is defined by the following equation (1):

$$\text{electrode duty} = 2 \times W/\lambda \qquad (1)$$

where $\lambda$ denotes the wavelength of a one-terminal-pair SAW resonator, and W denotes the line width of an interdigital electrode, referring to FIG. 5.

Figure 6:
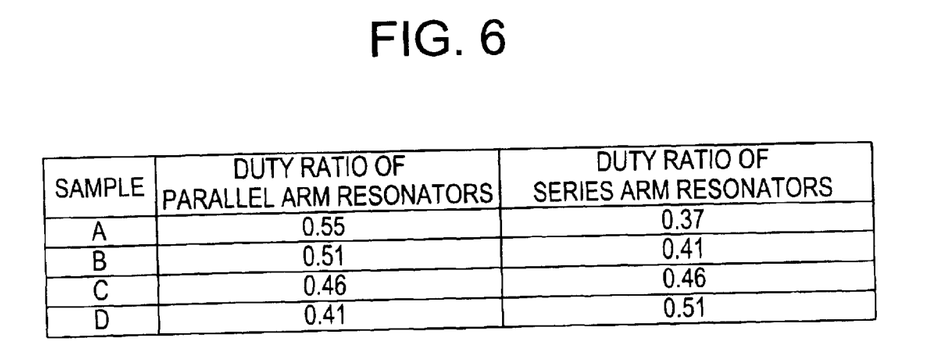
FIG. 6 is a table of the electrode duty of four experimental samples A to D.

FIG. 6 is a table of the electrode duty in four samples A to D used in the experiment. In this experiment, as shown in FIG. 6, the series arm resonators 2a and 2b have the same structure, each having an interdigital width of about 17 μm between the interdigitated fingers of the interdigital electrodes 21, and an electrode pitch of about 0.99 μm (the surface acoustic wave has a wavelength of about 1.99 μm). Each of the resonators 2a and 2b includes a single IDT 21 having 100 electrode finger pairs (200 fingers in total), and two reflectors 22, each reflector having 100 electrode fingers. The parallel arm resonators 3a, 3b, and 3c have the same structure, each having an interdigital width of about 50

μm, and an electrode pitch of about 1.04 μm (the surface acoustic wave has a wavelength of about 2.07 μm). Each of the resonators 3a, 3b and 3c includes a single IDT 31 having 40 electrode finger pairs (80 fingers in total), and two reflectors 32, each reflector having 100 electrode fingers.

After the series arm resonators 2a and 2b, and the parallel arm resonators 3a, 3b, and 3c were formed, an insulating film (not shown) made of $SiO_2$ was deposited on the entire substrate 1 including the series arm resonators 2a and 2b, and the parallel arm resonators 3a, 3b, and 3c by sputtering. The thickness of the deposited insulating film in this preferred embodiment is about 1.7% of the average wavelength of the series arm resonators 2a and 2b, and the parallel arm resonators 3a, 3b, and 3c.

Ground electrodes 4 and hot electrodes 5 are electrically connected to the resonators 2a, 2b, 3a, 3b, and 3c via lead electrodes 10. The ground electrodes 4 and the hot electrodes 5 are also used as points at which the frequency characteristic of the resonators 2a, 2b, 3a, 3b, and 3c is measured by wafer probing. The wafer probing is a method to contact ground pins and hot pins of a wafer prober (not shown) with the ground electrodes 4 and the hot electrodes 5, respectively, to measure a frequency. Based on the measurement result, the amount of frequency adjustment is determined.

Then, the $SiO_2$ film was etched for the etching time which was calculated from the amount of frequency adjustment to decrease the film thickness, thereby achieving the desired frequency characteristic. Either dry or wet etching may be used. In the illustrated preferred embodiment, the film thickness was reduced by about 0.6% of the average wavelength of the series arm resonators 2a and 2b, and the parallel arm resonators 3a, 3b, and 3c.

The experimental results with respect to the samples A to D are described with reference to the graphs shown in FIGS. 7A and 7B.

Figure 7A:
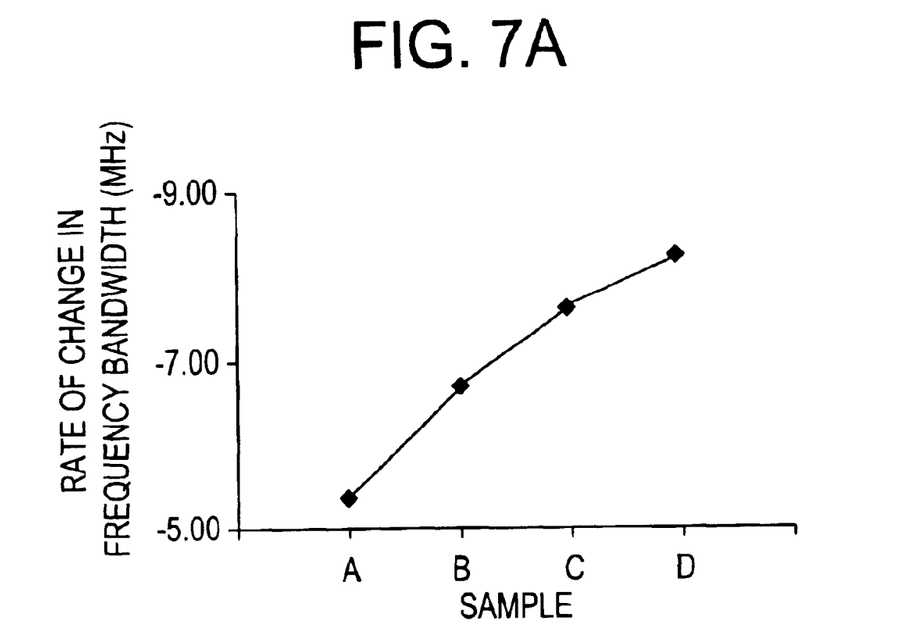
FIGS. 7A and 7B are graphs of the rate of change in the bandwidth, as experimental results, before and after deposition of an $SiO_2$ film, and before and after frequency adjustment, respectively.
Figure 7B:
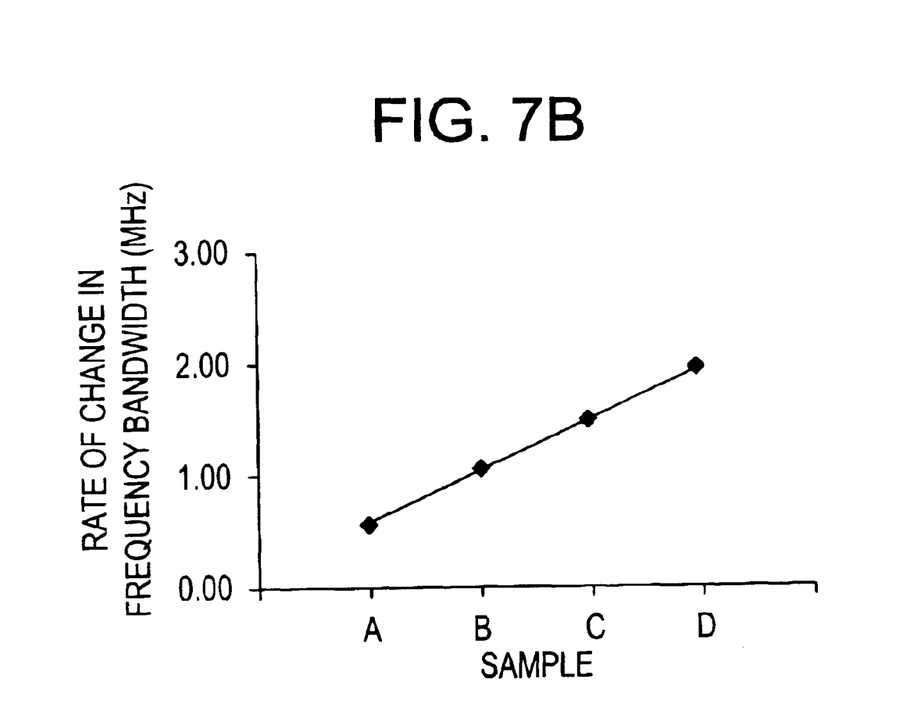

FIG. 7A is a graph showing the rate of change in the frequency bandwidth before and after an insulating film made of $SiO_2$ is deposited, and FIG. 7B is a graph showing the rate of change in the frequency bandwidth before and after the frequency adjustment by etching the resultant film.

It is obvious from FIG. 7A that the samples A and B exhibit a smaller decrease in the frequency bandwidth than the sample C when the insulating film is deposited. In the samples A and B, the electrode duty of the parallel arm resonators 3a, 3b, and 3c is greater than the electrode duty of the series arm resonators 2a and 2b. In the sample C, as usual, the electrode duty of the parallel arm resonators 3a, 3b, and 3c is substantially the same as that of the series arm resonators 2a and 2b.

As shown in FIG. 7B, after the frequency adjustment by etching, the samples A and B in which the electrode duty of the parallel arm resonators 3a, 3b, and 3c is greater than the electrode duty of the series arm resonators 2a and 2b exhibit a smaller increase in the frequency bandwidth than the sample C in which the electrode duty of the parallel arm resonators 3a, 3b, and 3c is the same as that of the series arm resonators 2a and 2b, thereby more precisely adjusting the frequency characteristic. A narrow or wide frequency bandwidth may sometimes cause defects, and it is advantageous to prevent an increase in the frequency bandwidth.

It is clear from the experimental results that, as the electrode duty of parallel arm resonators is greater than the electrode duty of series arm resonators, the bandwidth varies less, thereby more easily achieving the desired frequency adjustment. Importantly, if the electrode duty of parallel arm resonators is much greater, conversely, the frequency bandwidth will possibly be degraded.

As seen in FIG. 3, around the point where the electrode duty exceeds approximately 0.5, the shift amount of the frequency bandwidth substantially levels off. Accordingly, since the amount of increase or decrease in the frequency bandwidth depends upon the difference of the resonant frequency $f_{rp}$ of the parallel arm resonators 3a, 3b, and 3c and the anti-resonant frequency $f_{as}$ of the series arm resonators 2a and 2b, a decrease in the frequency bandwidth is suppressed in particular when the electrode duty of the parallel arm resonators 3a, 3b, and 3c is greater than the electrode duty of the series arm resonators 2a and 2b, and when the electrode duty of the series arm resonators 2a and 2b is equal to about 0.5 or less, thereby more readily achieving the desired frequency characteristic, as revealed by the experiments described above. The tendency for the shift amount of the frequency bandwidth to level off when the electrode duty exceeds approximately 0.5 is observed not only under the condition shown in FIG. 3 but also under the condition of the illustrated preferred embodiment.

Figure 8A:
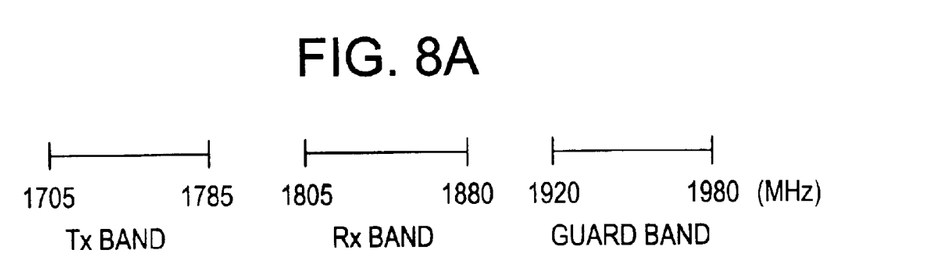
FIGS. 8A and 8B are views of frequency bands of a DCS filter and a GSM-1900 filter, respectively.
Figure 8B:
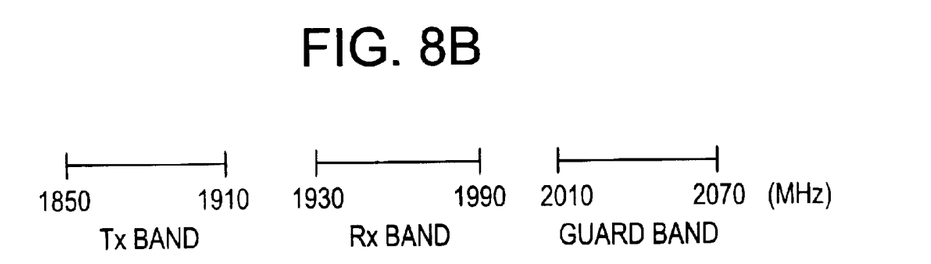

The SAW filter according to various preferred embodiments of the present invention may be used, for example, as a receiver RF filter of a communication apparatus that complies with the DCS (having a central frequency of 1842.5 MHz) or DSM-1900 (having a central frequency of 1960 MHz) standard. FIGS. 8A and 8B show frequency bands of a DCS filter and a DSM-1900 filter, respectively. In the DCS receiver RF filter, the attenuation standards (the Tx band and the guard band) are at both ends of the pass band and are separated therefrom by 20 MHz and 40 MHz. In the GSM-1900 receiver RF filter, the attenuation standards (the Tx band and the guard band) are at both ends of the pass band and are each separated therefrom by 20 MHz. Since the attenuation standards are in the vicinity of both high and low frequency regions of the pass band of the receiver RF filters complying with both standards, a narrow or wide bandwidth may causes defects. For this purpose, a SAW filter produced according to a frequency adjusting method of a preferred embodiment of the present invention with a smaller increase or decrease in the bandwidth is suitable. Of course, the SAW filter according to preferred embodiments of the present invention is not limited to DCS and GSM-1900 filters. In particular, a filter of the type in which the attenuation standards are within a frequency range of about 2.5% from both the high or low frequency regions of the pass band with respect to the central frequency would be effective.

The materials of the substrate 1, the interdigital electrodes 21 and 31, and the insulating film, and other data including the wavelength of the resonators are not limited to the preferred embodiments described above. A variety of modifications and variations may be made without departing from the spirit and scope of the invention.

As described above, according to preferred embodiments of the present invention, the electrode duty of the parallel arm resonators is greater than the electrode duty of the series arm resonators. This prevents degradation of the frequency bandwidth when an insulating film is deposited. Thus, an insulating film having a greater thickness can be deposited, and it functions as a protective film, thereby increasing reliability.

The desired frequency characteristic will also be achieved by depositing an insulating film having a uniform thickness on the entire piezoelectric substrate containing resonators. Therefore, a single deposition of the insulating film is sufficient, thus contributing to a simple process, reduced production cost, and improved yield. Furthermore, the shift amount of the frequency bandwidth for frequency adjustment is less, thereby achieving the frequency adjustment by etching the film while satisfying the desired filter characteristic.

A communication apparatus including a SAW filter according to preferred embodiments of the present invention is inexpensive and have the desired frequency characteristic. In particular, the present invention may be suitably embodied, for example, as a GSM-1900 or DCS filter for use in a communication apparatus in which a narrow or wide bandwidth may cause defects.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter comprising:

a piezoelectric substrate; and a plurality of one-terminal-pair surface acoustic resonators disposed on said piezoelectric substrate, each of the plurality of one-terminal-pair surface acoustic resonators including interdigital electrodes disposed on said piezoelectric substrate, and an insulating film deposited on and adhered to the interdigital electrodes;

wherein at least one of said plurality of one-terminal-pair surface acoustic resonators is a series arm resonator, and at least one of the remaining one-terminal-pair surface acoustic resonators is a parallel arm resonator, the series arm resonator and the parallel arm resonator are coupled in a ladder arrangement, the electrode duty of the parallel arm resonator is greater than the electrode duty of the series arm resonator, the electrode duty of a one-terminal pair surface acoustic resonator being defined by the following equation (1):

$$\text{electrode duty} = 2 \times W / \lambda \quad (1)$$

where $\lambda$ denotes the wavelength of the one-terminal-pair surface acoustic wave resonator, and W denotes the line width of an interdigital electrode.

2. A surface acoustic wave filter according to claim 1, wherein the piezoelectric substrate is a 36° rotated Y-cut X-propagation LiTaO$_3$ substrate.

3. A surface acoustic wave filter according to claim 1, wherein the electrode duty of the parallel arm resonator is about 0.51 to about 0.55.

4. A surface acoustic wave filter according to claim 1, further comprising reflectors arranged at both ends of the interdigital electrodes.

5. A surface acoustic wave filter according to claim 1, wherein the insulating film is SiO$_2$.

6. A surface acoustic wave filter according to claim 1, wherein the surface acoustic wave fitter is a receiver RF filter.

7. A surface acoustic wave filter according to claim 1, wherein the thickness of the insulating film has a dimension that achieves a predetermined frequency characteristic.

8. A surface acoustic wave filter according to claim 1, wherein the electrode duty of at least one series arm resonator is about 0.5 or less.

9. A communication apparatus comprising at least one surface acoustic wave filter according to claim 1.

10. A surface acoustic wave filter comprising:

a piezoelectric substrate; and a plurality of one-terminal-pair surface acoustic resonators disposed on said piezoelectric substrate, each of the plurality of one-terminal-pair surface acoustic resonators including interdigital electrodes disposed on said piezoelectric substrate, and an insulating film deposited on and adhered to the interdigital electrodes;

wherein at least one of said plurality of one-terminal-pair surface acoustic resonators is a series arm resonator, and at least one of the remaining one-terminal-pair surface acoustic resonators is a parallel arm resonator, the series arm resonator and the parallel arm resonator are coupled in a ladder arrangement, the electrode duty of the parallel arm resonator is greater than the electrode duty of the series arm resonator, the electrode duty of a one-terminal pair surface acoustic resonator being defined by the following equation (1):

$$\text{electrode duty} = 2 \times W / \lambda \quad (1)$$

where $\lambda$ denotes the wavelength of the one-terminal-pair surface acoustic wave resonator, and W denotes the line width of an interdigital electrode, and the thickness of the electrode in each of the SAW resonators is about 9.2% of the average wavelength of the series arm resonators and the parallel arm resonators.

* * * * *